United States Patent
Zhan et al.

(10) Patent No.: US 10,644,190 B2
(45) Date of Patent: May 5, 2020

(54) COUNTERBORE POCKET STRUCTURE FOR FLUIDIC ASSEMBLY

(71) Applicant: Sharp Laboratories of America, Inc., Camas, WA (US)

(72) Inventors: Changqing Zhan, Vancouver, WA (US); Paul John Schuele, Washougal, WA (US); Mark Albert Crowder, Portland, OR (US); Sean Mathew Garner, Elmira, NY (US); Timothy James Kiczenski, Corning, NY (US)

(73) Assignee: eLux Inc., Vancouver, WA (US)

( * ) Notice: Subject to any disclaimer, the term of this patent is extended or adjusted under 35 U.S.C. 154(b) by 0 days.

(21) Appl. No.: 15/859,671

(22) Filed: Jan. 1, 2018

(65) Prior Publication Data
US 2018/0138355 A1    May 17, 2018

Related U.S. Application Data (63) Continuation of application No. 14/530,230, filed on Oct. 31, 2014, now abandoned.

(51) Int. Cl.
| | |
|---|---|
| *H01L 33/00* | (2010.01) |
| *H01L 25/075* | (2006.01) |
| *H01L 23/00* | (2006.01) |

(52) U.S. Cl.
CPC ............ *H01L 33/005* (2013.01); *H01L 24/95* (2013.01); *H01L 25/0753* (2013.01);
(Continued)

(58) Field of Classification Search
CPC ......... H01L 2224/95085; H01L 33/005; H01L 2224/95101; H01L 2224/95136; H05K 13/027
See application file for complete search history.

(56) References Cited

U.S. PATENT DOCUMENTS

| | | | |
|---|---|---|---|
| 6,723,576 B2 * | 4/2004 | Nozawa | H01L 24/95 438/113 |
| 6,821,805 B1 | 11/2004 | Nakamura et al. | |

(Continued)

FOREIGN PATENT DOCUMENTS

| | | |
|---|---|---|
| CN | 1529915 | 7/2004 |
| CN | 20051005621 | 8/2005 |

(Continued)

OTHER PUBLICATIONS

Park et al, "A First Implementation of an Automated Reel-to-Reel Fluidic Self-Assembly Machine", Adv. Mater. 2014.
(Continued)

*Primary Examiner* — Jose R Diaz
(74) *Attorney, Agent, or Firm* — HDC IP Law LLP (57) ABSTRACT

A fluidic assembly method is provided that uses a counterbore pocket structure. The method is based upon the use of a substrate with a plurality of counterbore pocket structures formed in the top surface, with each counterbore pocket structure having a through-hole to the substrate bottom surface. The method flows an ink with a plurality of objects over the substrate top surface. As noted above, the objects may be micro-objects in the shape of a disk. For example, the substrate may be a transparent substrate and the disks may be light emitting diode (LED) disks. Simultaneously, a suction pressure is created at the substrate bottom surface. In response to the suction pressure from the through-holes, the objects are drawn into the counterbore pocket structures. Also provided is a related fluidic substrate assembly.

25 Claims, 7 Drawing Sheets

(52) U.S. Cl.
CPC .............................. *H01L 33/0095* (2013.01); *H01L 2224/95085* (2013.01); *H01L 2224/95136* (2013.01); *H01L 2924/10156* (2013.01); *H01L 2924/12041* (2013.01); *H01L 2933/0033* (2013.01)

(56) References Cited

U.S. PATENT DOCUMENTS

| | | | |
|---|---|---|---|
| 6,927,382 | B2 | 8/2005 | King et al. |
| 7,560,803 | B2 * | 7/2009 | Onozawa ............... H01L 24/95 257/656 |
| 7,727,788 | B2 | 6/2010 | Han et al. |
| 2003/0057444 | A1 | 3/2003 | Niki et al. |
| 2007/0224713 | A1 | 9/2007 | Han et al. |
| 2008/0036038 | A1 | 2/2008 | Herssee et al. |
| 2010/0276664 | A1 | 11/2010 | Hersee |

FOREIGN PATENT DOCUMENTS

| | | |
|---|---|---|
| CN | 1661869 | 10/2005 |
| CN | 101443887 | 3/2007 |
| JP | 2007 67182 | 3/2007 |

OTHER PUBLICATIONS

"Fluidic Self Assembly for the Integration of GaAs Light-Emitting Diodes on si Substrates" Photonics Technology Letters, IEEE (vol. 6, Issue 6) Jun. 1994, pp. 706-708.

Chung et al, "Guided and Fluidic Self-Assembley of Microstructures Using Railed Microfluicic Channels", Nature Materials, 7, 581-587 (2008).

* cited by examiner

COUNTERBORE POCKET STRUCTURE FOR FLUIDIC ASSEMBLY

RELATED APPLICATIONS

This application is a Continuation of U.S. patent application Ser. No. 14/530,230 entitled "Counterbore Pocket Structure For Fluidic Assembly" and filed Oct. 31, 2014 by Zhan et al. The entirety of the aforementioned application is incorporated herein by reference for all purposes.

BACKGROUND OF THE INVENTION

1. Field of the Invention

This invention generally relates to integrated circuit (IC) fabrication and, more particularly, to a fluidic assembly process for the placement of microstructures on an IC substrate.

2. Description of the Related Art

The transfer of microfabricated electronic devices, optoelectronic devices, and sub-systems from a donor substrate/wafer to a large area and/or unconventional substrate provides a new opportunity to extend the application range of electronic and optoelectronic devices. For example, display pixel size light emitting diode (LED) micro structures, such as rods, fins or disks, can be first fabricated on small size wafers and then be transferred to large panel glass substrate to make a direct emitting display.

Existing transfer techniques such as inkjet printing, robotic pick-and-place, and fluidic self-assembly work reasonable well in certain particular applications. However, these conventional techniques are either not cost effective or so poor in yield that they cannot be applied to directly transfer LED micro structures.

It would be advantageous if microstructure objects could be precisely located on a substrate using a low cost method with a high yield.

SUMMARY OF THE INVENTION

Disclosed herein is a counterbore pocket structure for micro-object fluidic assembly, where the micro-objects may, for example, be light emitting diode (LED) micro disks. A "keyhole" shape pocket combines the advantages of a second circular pocket with a loose tolerance, for easy disk capture, and a first circular pocket with a tighter tolerance having a zero or minimum disk-to-pocket gap. In addition, the arrangement of a through-hole, off center from the narrow part of the pocket, enhances the suction force on the captured micro disk, so that the disk is pulled towards the appropriate position until it forms a tight contact with the edge of the pocket, achieving the desirable near-zero gap between the pocket and the disk.

Moreover, a modification on the wide part of the keyhole shape counterbore pocket prevents an "extra" micro disk from becoming trapped in the wide part of the pocket. By modifying the wide part of the keyhole shape pocket from a simple circular shape to a "third-quarter crescent moon" shape, the crescent moon pocket shape only captures a single micro disk, while inheriting all the advantages on the circular design.

The counterbore pocket structure not only improves efficiency and yield in a fluidic based LED micro structures distribution process, but also relaxes the requirements on subsequent fabrication steps. For example, the near-zero gap between the pocket edge and the disk makes the passivation and planarization processes much easier so that, again, both fabrication yield and long term reliability are improved significantly.

Accordingly, a fluidic assembly method is provided that uses a counterbore pocket structure. The method is based upon the use of a substrate with a plurality of counterbore pocket structures formed in the top surface, with each counterbore pocket structure having a through-hole to the substrate bottom surface. The method flows an ink with a plurality of objects over the substrate top surface. As noted above, the objects may be micro-objects in the shape of a disk. For example, the substrate may be a transparent substrate and the disks may be LED disks. Simultaneously, a suction pressure is created at the substrate bottom surface. In response to the suction pressure from the through-holes, the objects are drawn into the counterbore pocket structures.

In one aspect, the counterbore pocket structures have a sliding fit diameter to accommodate a disk diameter that permits a disk to rotate or slide freely in the pocket. Alternatively, the counterbore pocket structures have a keyhole shape with a first portion overlying the through-hole having a first diameter sliding or transition fit to accommodate a disk diameter, and a second portion overlapping the first portion, having a second diameter greater than the first diameter. In one variation, the through-hole is offset from the first diameter center, away from the second portion. In another variation, the second portion has a crescent moon-shape with a second diameter greater than the first diameter.

More explicitly, the step of flowing the ink over the substrate top surface may involve arranging the substrate top surface with a substrate first side higher than a substrate second side, and introducing the ink to the substrate first side. Then, the disks are drawn into the counterbore pocket structures in response to gravity as well as suction pressure.

Additional details of the above-described method, as well a fluidic substrate assembly, are provided below.

DETAILED DESCRIPTION

Figure 1:
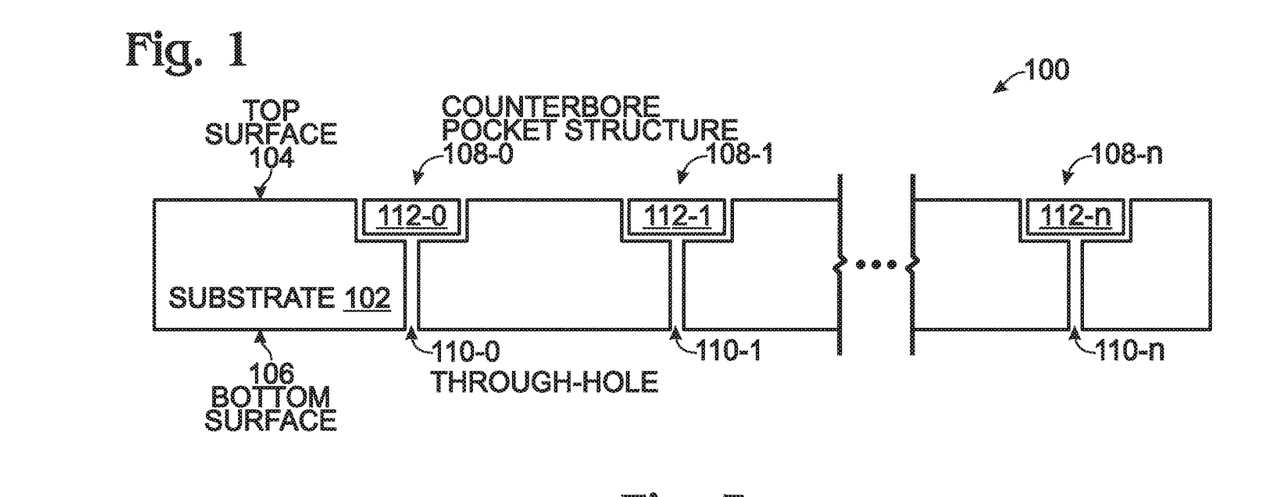
FIG. 1 is a partial cross-sectional view of a fluidic assembly substrate.

FIG. 1 is a partial cross-sectional view of a fluidic assembly substrate. The fluidic assembly substrate 100 comprises a substrate 102 with a top surface 104 and a bottom surface 106. In one aspect, the substrate 102 may be transparent to visible spectrum light, such as might be useful in the fabrication of electronic displays and optical sensors. A plurality of counterbore pocket structures are formed in the substrate top surface 104, designated as 108-0 through 108-n, where n is not limited to any particular positive integer value. Through-holes, 110-0 through 110-n are respectively formed between each counterbore pocket structure 108-0 through 108-n and the substrate bottom surface 106. As used herein, a the word "counterbore" is understood to be a recess, which is typically cylindrical, around a hole in a surface plane. It is also typical that object inserted into the counterbore is intended to be flush (level) with the surface plane. Although examples of circular and keyhole shaped pocket structures are provided below, it should be understood that the pocket structure is not necessarily limited to any particular shape. In one aspect, a finished substrate assembly would further comprise objects 112-0 through 112-n at least sliding fit-positioned inside each counterbore pocket structure 108-0 through 108-n, respectively. Alternatively, the objects may be a transition fit inside the counterbore pocket structure. Again, although disk structures are mentioned below as an example, the assembly is not necessarily limited to any particular object shape. In one aspect, the object 112 is a light emitting diode (LED) disk. In another aspect, the objects are photodiodes (PDs), which may also be formed in the shape of a disk.

As used herein, the word "fit" refers to the mating of two mechanical components. Manufactured parts are very frequently required to mate with one another. They may be designed to slide freely against one another or they may be designed to bind together to form a single unit or assembly. There are three general categories of fits. A clearance fit may be desirable for an object to rotate or slide freely within the counterbore, this is usually referred to as a "sliding fit." An interference fits may be desirable for when as object is to be securely held within the counterbore, this is usually referred to as an interference fit. A transition fits may be desirable for when the object is to be held securely, yet not so securely that it cannot be disassembled or rotated in the counterbore, this is usually referred to herein as a location or transition fit.

Figure 2:
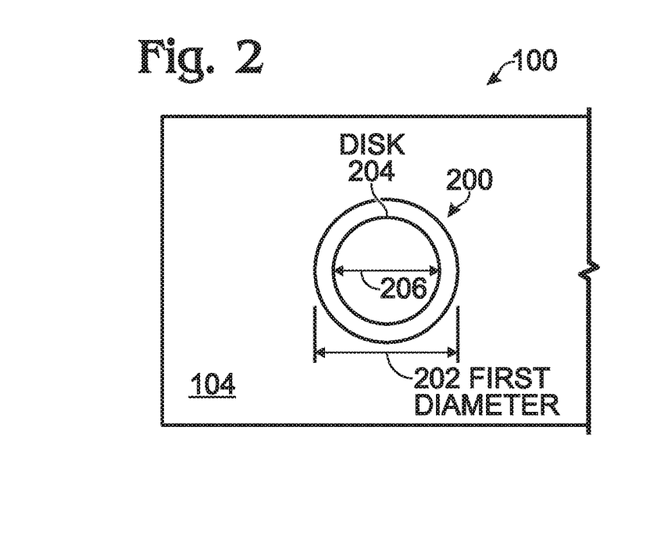
FIG. 2 is a plan view depicting a first variation of the fluidic assembly substrate in detail.

FIG. 2 is a plan view depicting a first variation of the fluidic assembly substrate in detail. In this aspect, counterbore pocket structure 200 has a first diameter 202. In a substrate assembly, the counterbore pocket structure first diameter 202 forms a sliding fit to accommodate a disk 204 with a diameter 206. Alternatively, the fit may be a transition fit. Typically, the second diameter is larger than a clearance (sliding) fit so that it can enable easy capture of a micro disk, while being no larger than approximate 1.5× of the disk's diameter, so that the counterbore pocket structure does not trap more than one disk.

Figure 3:
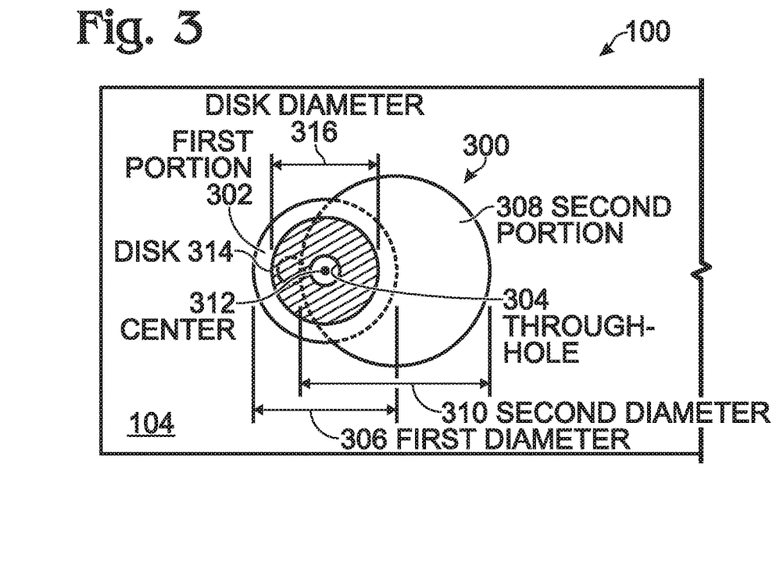
FIG. 3 is a plan view depicting a second variation of the fluidic assembly structure in detail.

FIG. 3 is a plan view depicting a second variation of the fluidic assembly structure in detail. In this aspect, counterbore pocket structure 300 has a keyhole shape with a first portion 302 overlying a through-hole 304, having a first diameter 306. A second portion 308 overlaps the first portion (as shown in phantom) and has a second diameter 310 greater than the first diameter. In another variation, the through-hole 304 is offset from the first diameter center 312, away from the second portion 308, as shown in phantom. In a substrate assembly, the first diameter 306 may be either a sliding fit or a transition fit to accommodate a disk 314 with a disk diameter 316.

Figure 4:
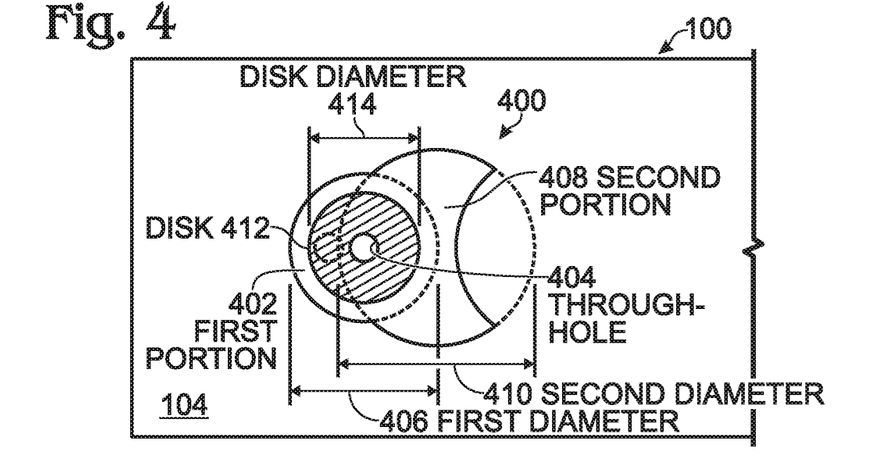
FIG. 4 is a plan view depicting a third variation of the fluidic assembly structure in detail.

FIG. 4 is a plan view depicting a third variation of the fluidic assembly structure in detail. In this aspect, the counterbore pocket structure 400 has a keyhole shape with a first portion 402 overlying the through-hole 404, with a first diameter 406. A second portion 408 overlaps the first portion 402, and has a crescent moon-shape, or three-quarters crescent moon-shape, with a second diameter 410 greater than the first diameter 406. In a substrate assembly, the first diameter 406 may be either a sliding fit or a transition fit to accommodate a disk 412 with a disk diameter 414. As in FIG. 3, the through-hole 404 may be offset away from the second portion 408, as shown in phantom.

A fluidic assembly technique permits the distribution of fabricated objects, such as LED micro structures in the form of disks, to be exactly placed on a substrate. Exact placement permits subsequent interconnection processes, even though the disks are very small in size. Initially, an ink is prepared as follows. The LED micro disks are first fabricated on a small substrate. The LED micro disks are harvested using laser liftoff, when the disks are gallium nitride (GaN) for example, or wet chemical etch, when the disks are galliumindium arsenide phosphide (GaInAsP) for example, and form an ink in a solvent. The target substrate is prepared as follows. An array of through-holes is fabricated in a large area substrate such as glass. Counterbore holes are formed with a diameter slighter larger than LED micro disk diameter, to a depth equal to the LED micro disk thickness, overlying the through-holes, either by direct etch into the same substrate or on a laminated second layer thin film which has the same thickness as the micro disks (see FIG. 12).

Figure 5A:
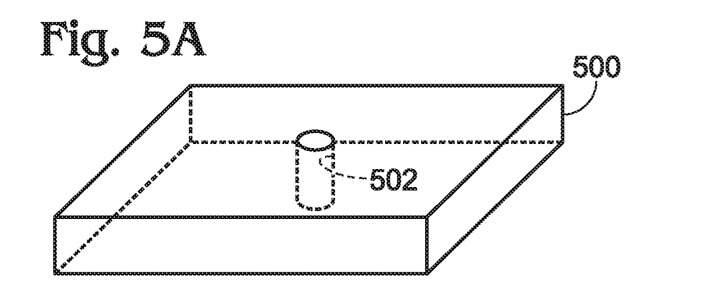
FIGS. 5A, 5B, 5C, and 5D are each a different perspective view of a fluidic assembly process.
Figure 5B:
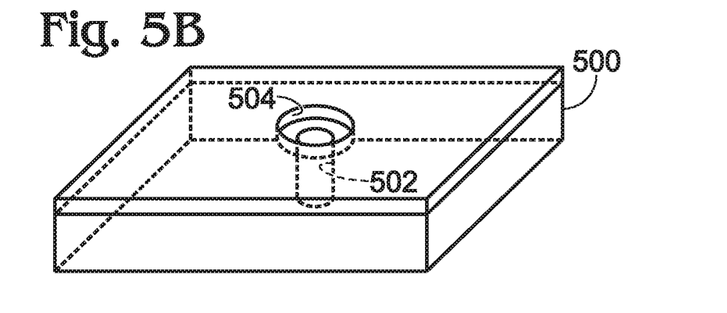
Figure 5C:
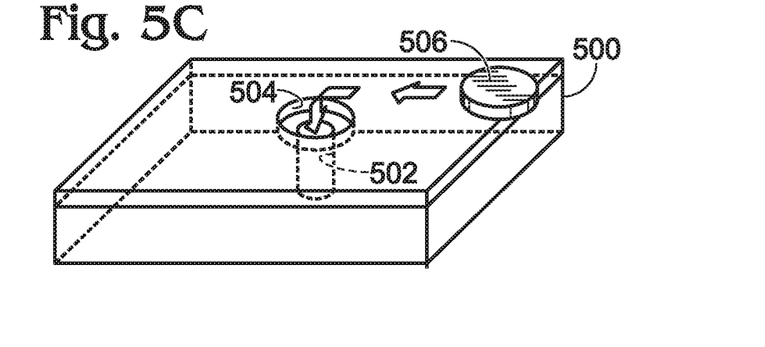
Figure 5D:
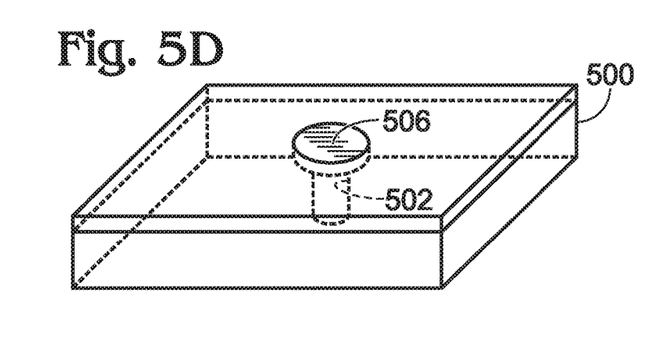

FIGS. 5A through 5D are perspective views depicting a fluidic assembly process. A through-hole 502 is formed in the substrate 500, as shown in FIG. 5A. In FIG. 5B, the counterbore 504 is formed over the through-hole 502. The substrate is then mounted into the fluidic assembly system at an optimal tilting angle. In FIG. 5C the carrier fluid (ink) flows over the top surface due to the gravity and a suction pressure from the substrate bottom by vacuum via the through-hole 502. In FIG. 5D, an LED micro disk 506 falls into the counterbore pocket structure, and caps the through-hole 502.

Figure 6A:
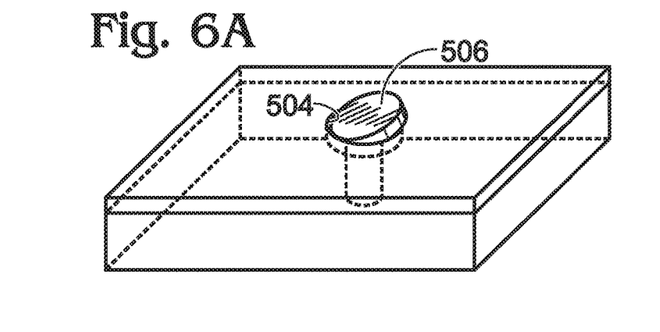
FIGS. 6A, 6B, 6C, 6D, 6E, and 6F are each a different perspective view of problems that may occur as a result of tolerance issues.
Figure 6B:
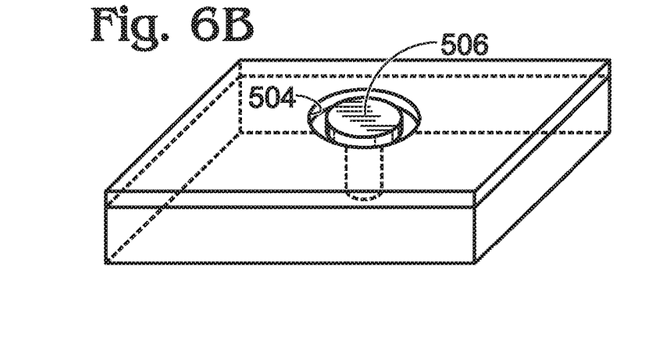
Figure 6C:
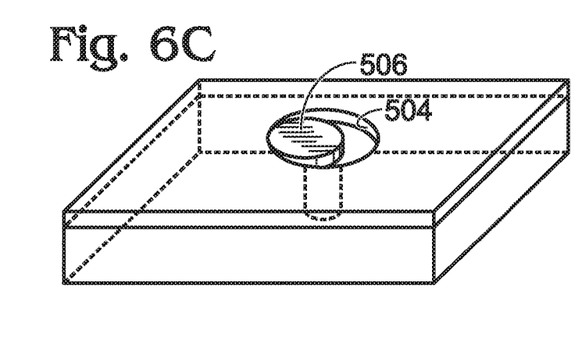
Figure 6D:
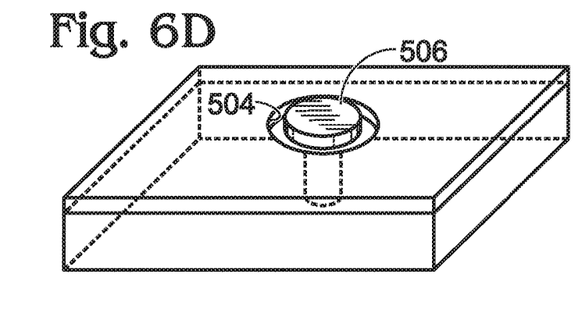
Figure 6E:
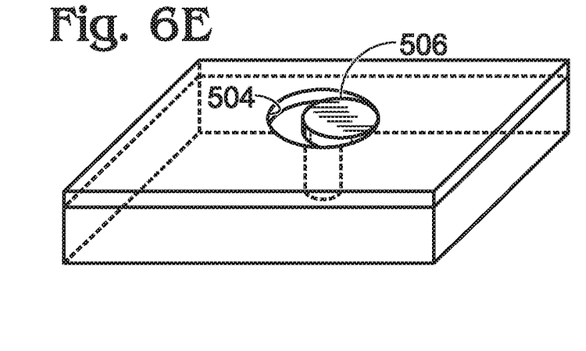
Figure 6F:
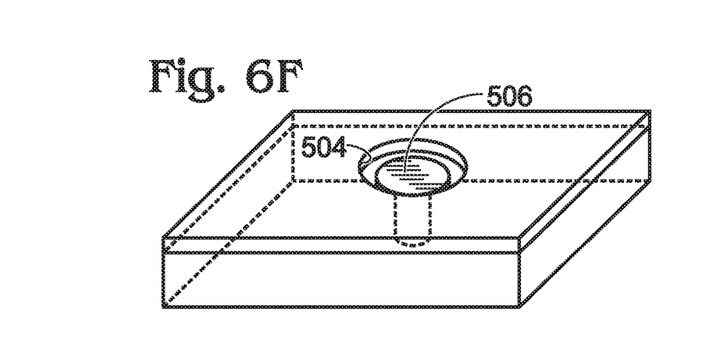

FIGS. 6A through 6F are perspective views depicting problems that may occur as a result of tolerance issues. One challenge is the selection of the tolerance between the counterbore pocket diameter and the micro disk diameter. If the tolerance is too tight, then there is a chance that stiction may cause a micro disk 506 to "hang" on the edge of the counterbore pocket structure, as shown in FIG. 6A. However, while a large tolerance may avoid the sticking pocket edge issue of FIG. 6A, the random distributions of the disk 506 inside the counterbore pocket structure, as shown in FIGS. 6B through 6F, make the post distribution processes very difficult due to the random distributed gap between the micro disk and the counterbore pocket structure.

Figure 7:
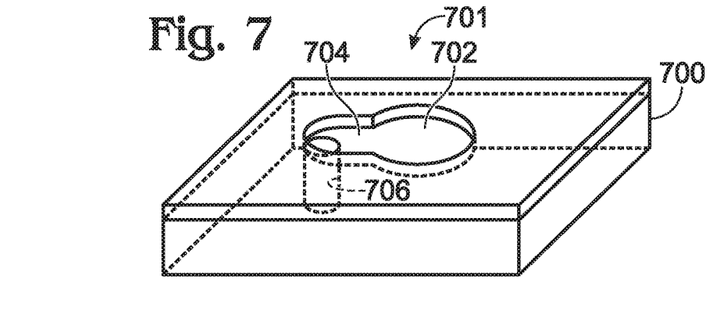
FIG. 7 is a perspective view depicting an exemplary keyhole shape counterbore pocket structure.

FIG. 7 is a perspective view depicting an exemplary keyhole shape counterbore pocket structure. The keyhole structure addresses both the problem of randomly distributed disks, by aligning the disks in predictable positions, and the problem of stiction due to too tight a tolerance. Instead of using a highly symmetric circular shape counterbore pocket structure, a keyhole shape counterbore pocket structure 701 has a wide part (second portion) 702 formed in substrate 700, with a larger diameter to more easily capture a micro disk, as well as a narrow part (first portion) 704 with a tighter tolerance to lock the trapped micro disk into a predetermined position. In addition, the through-hole 706 is arranged off the center of the narrow part 704 of pocket so that a micro disk becomes positioned at the top of the through-hole, with a minimum gap between the pocket edge and the micro disk.

Figure 8A:
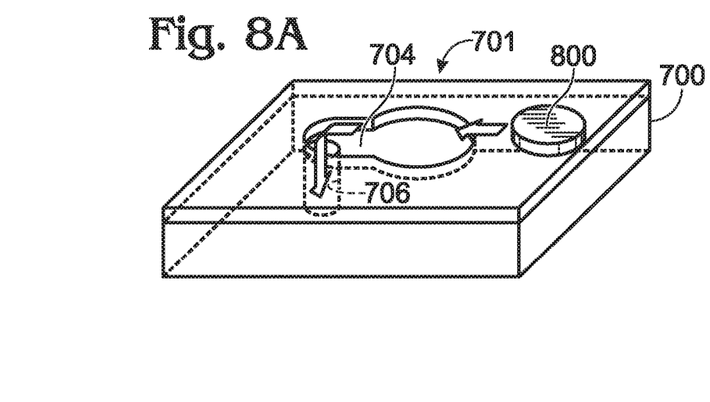
FIGS. 8A, 8B, 8C, and 8D are each a different perspective view of a fluidic assembly process using the keyhole shape counterbore pocket structure.
Figure 8B:
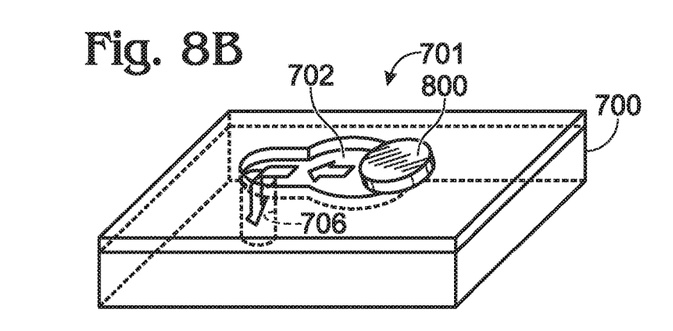
Figure 8C:
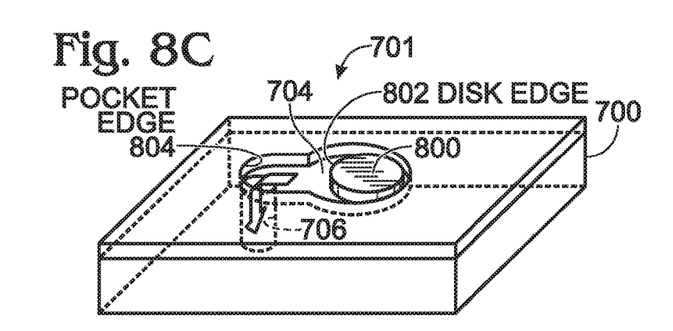
Figure 8D:
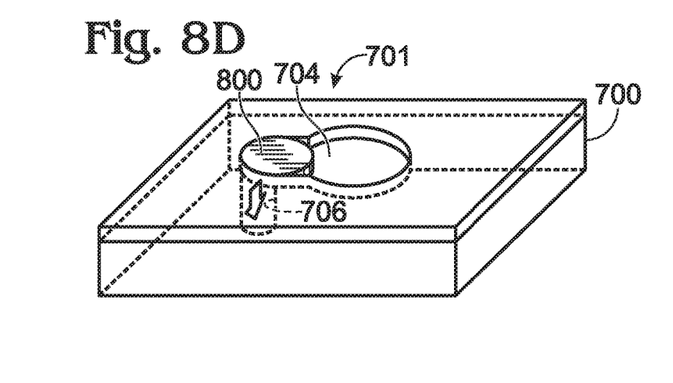

FIGS. 8A through 8D depicting a fluidic assembly process using the keyhole shape counterbore pocket structure. In FIG. 8A the substrate 700 with the keyhole shape counterbore pocket structure 701 is then mounted into the fluidic assembly system at an optimal tilting angle, and the carrier fluid flows over the top surface due to the gravity and a pulling pressure on the bottom by vacuum via the through-holes. A suspended micro disk 800 may be pushed and pulled by the flow from right to left. Once approaching the counterbore pocket structure 701, the micro disk 800 falls inside the counterbore pocket structure 701 without difficulty since the wide part of the counterbore pocket structure 701 has larger diameter than the micro disk, as shown in FIGS. 8B and 8C. In FIG. 8D, the micro disk 800 inside the counterbore pocket structure 701 continues moving towards the narrow part 704 of the counterbore pocket structure 701 due to the suction pressure via the through-hole 706. Since the through-hole 706 is arranged off the center of the narrow part 704 of the packet, the suction pressure keeps pulling the micro disk 800 until the micro disk's edge 802 (left on the drawing page) contacts the pocket edge 804 (left on the drawing page), forming a tight fit and capping the through-hole. Thus, the micro disk 800 has been placed in a predetermined position on the substrate with a near zero gap to the counterbore pocket structure 701 edge.

Distributing the micro disk into predetermined positions on the substrate significantly improves the fabrication yield in subsequent process steps, as the near zero gap between the micro disk and the counterbore pocket structure edge makes interconnections on arrayed micro disks array practical. For example, a simple passivation can also serve as planarization to reduce the step height in the gap so that standard interconnections process can be adopted without significant modifications, which also improves the interconnection yield.

Figure 9:
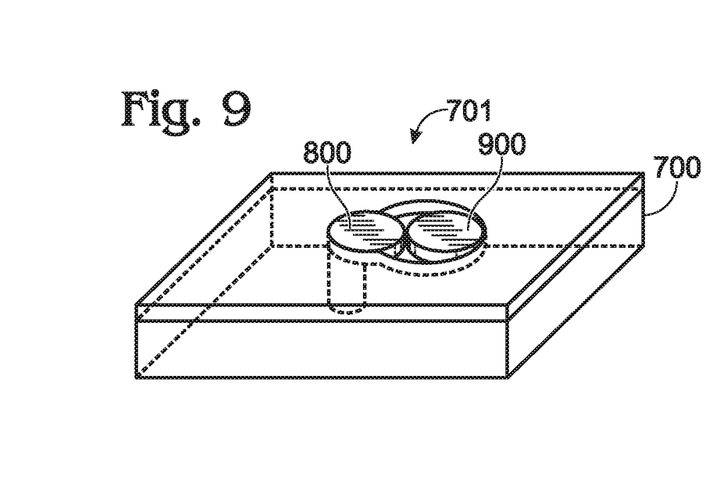
FIG. 9 depicts a potential issue that may affect the keyhole shape counterbore pocket structure of FIG. 3 and FIGS. 8A-8D.

FIG. 9 depicts a potential issue that may affect the keyhole shape counterbore pocket structure of FIG. 3 and FIGS. 8A-8D. After one micro disk 800 has been inserted into the lock position, another micro disk 900 could also be trapped into the wide part 702 of the counterbore pocket structure, as illustrated. This at least is a waste of micro disks.

Figure 10A:
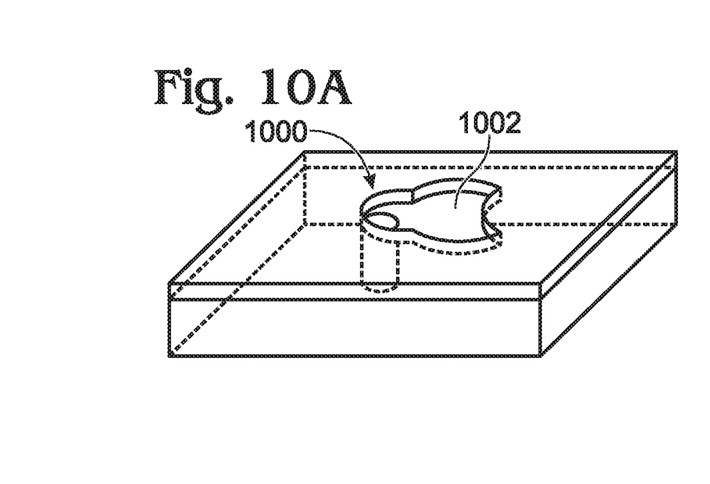
FIGS. 10A, 10B, and 10C each depict different process steps associated with the keyhole counterbore pocket structure of FIG. 4.
Figure 10B:
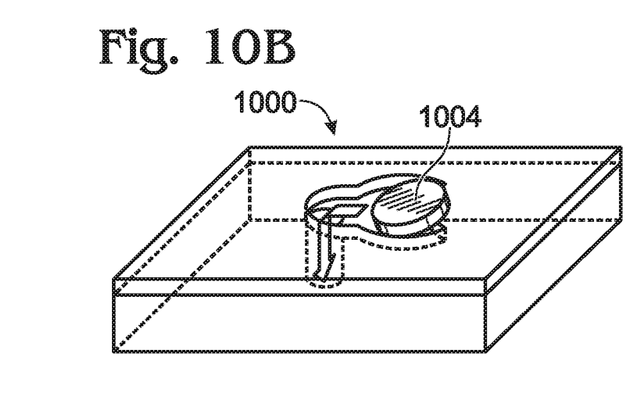
Figure 10C:
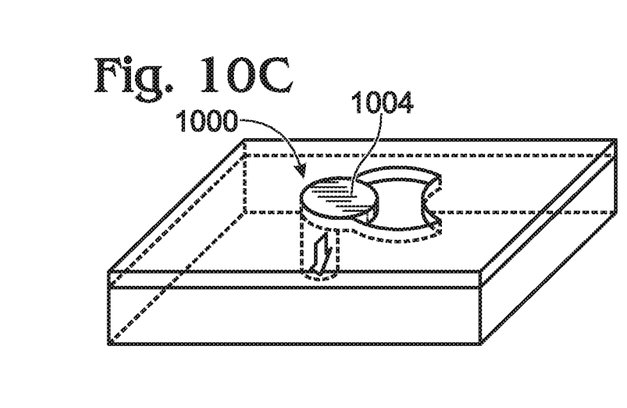

FIGS. 10A through 10C depict process steps associated with the keyhole counterbore pocket structure of FIG. 4. This crescent moon keyhole structure addresses the above-presented problem presented in the description of FIG. 9. As shown in FIG. 10A, a "third-quarter crescent moon" shape is used to replace the circular shape in the wide part 1002 of the keyhole shape counterbore pocket structure 1000. FIGS. 10B and 10C illustrate the micro disk distribution procedure using the modified counterbore pocket structure 1000. As shown, after one micro disk 1004 has been inserted into the lock position, there is no room for another micro disk to be accommodated.

In summary, the keyhole shape counterbore pocket structure is composed of a narrow circular part which has a tight tolerance with respect to the micro disk and a wide circular part which has looser tolerance with respect to the micro disk. The two parts are merged together along their common tangent lines. The counterbore pocket structure depth is equal to (or close to) the micro disk thickness, and is either etched into a glass substrate or formed on a laminated thin layer film. The counterbore pocket structure is able to enhance the performance of a fluidic based LED micro disk distribution process in at least three aspects:

1) The structure captures a micro disk in the flow easily, since the diameter of the wide part of the pocket is larger than the micro disk.

2) The arrangement of the through-hole, off center from the narrow part of the pocket, enhances the suction force on the captured micro disk so that the disk pulls into the predetermined position, forming a tight contact with the edge of the counterbore pocket structure.

3) The tight tolerance of the micro disk in the narrow part of the pocket makes passivation and planarization much easier, so that both fabrication yield and long term reliability are improved significantly.

Further, to overcome a potential issue of capturing an extra disk in the wide part of the counterbore pocket structure, a modification replaces the circular wide part with a "third-quarter crescent moon" shape, so that the new pocket shape only captures one micro disk, while inheriting all the advantages of the original design.

Figure 11:
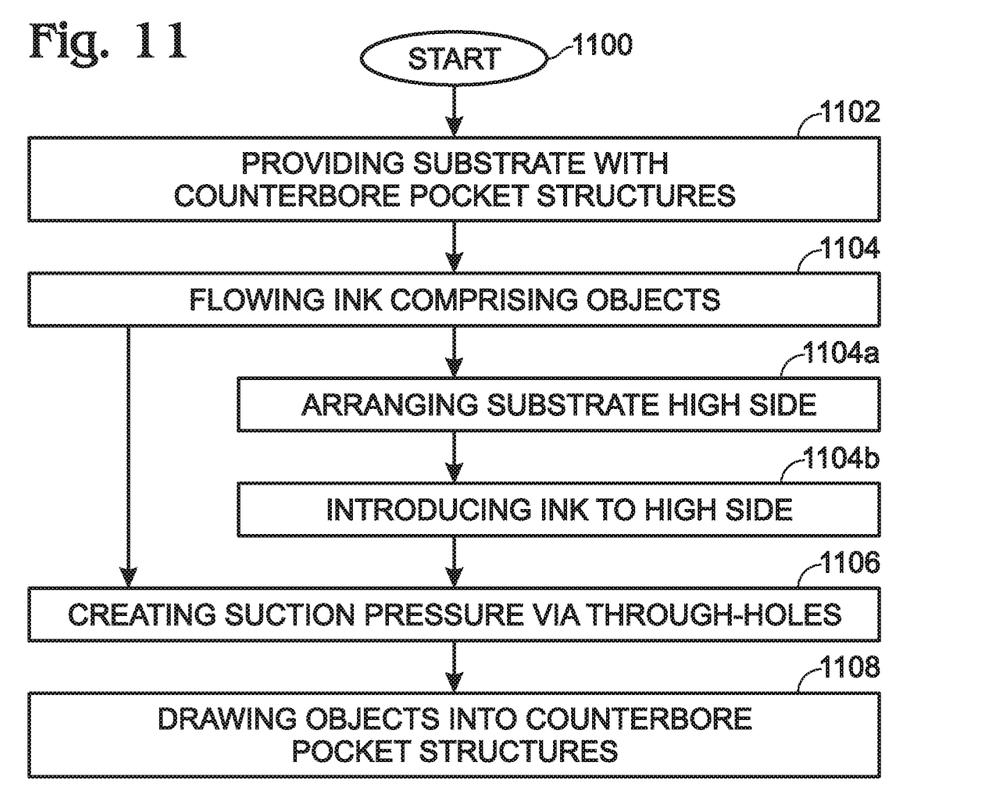
FIG. 11 is a flowchart illustrating a fluidic assembly method using a counterbore pocket structure.

FIG. 11 is a flowchart illustrating a fluidic assembly method using a counterbore pocket structure. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method is associated with the above-described figures and follows the numeric order of the depicted steps. The method starts at Step 1100.

Step 1102 provides a substrate comprising a top surface and a bottom surface, with a plurality of counterbore pocket structures formed in the top surface. Each counterbore pocket structure has a through-hole to the substrate bottom surface. Step 1104 flows an ink comprising a plurality of objects over the substrate top surface. In one aspect, the objects are in the shape of a disk. If so, Step 1102 provides counterbore pocket structures having a first diameter sliding fit to accommodate a disk diameter. Alternatively, the first diameter may be a transition fit. In another aspect, the substrate is transparent, and Step 1104 flows an ink comprising a plurality of LEDs or PDs in the shape of a disk over the substrate top surface. Step 1106 creates a suction pressure at the substrate bottom surface. In response to the suction pressure from the through-holes, Step 1108 draws the objects into the counterbore pocket structures.

In one variation, Step 1102 provides counterbore pocket structures having a keyhole shape with a first portion overlying the through-hole, with a first diameter transition fit to accommodate a disk diameter. Alternatively, the first diameter may form a sliding fit. The counterbore pocket structure has a second portion overlapping the first portion, with a second diameter greater than the first diameter. In one aspect, Step 1102 provides the through-hole offset from the first diameter center, away from the second portion.

In another variation, Step 1102 provides counterbore pocket structures having a keyhole shape with a first portion overlying the through-hole, with a first diameter transition (or sliding) fit to accommodate a disk diameter, and a second portion overlapping the first portion, having a crescent moon-shape with a second diameter greater than the first diameter. In one aspect, Step 1102 provides the through-hole offset from the first diameter center, away from the second portion.

In one aspect, flowing the ink over the substrate top surface in Step 1104 includes the following substeps. Step 1104a arranges the substrate top surface with a substrate first side higher than a substrate second side. Step 1104b introduces the ink to the substrate first side. Then, Step 1108 draws the disks in response to gravity, as well as suction pressure.

Figure 12:
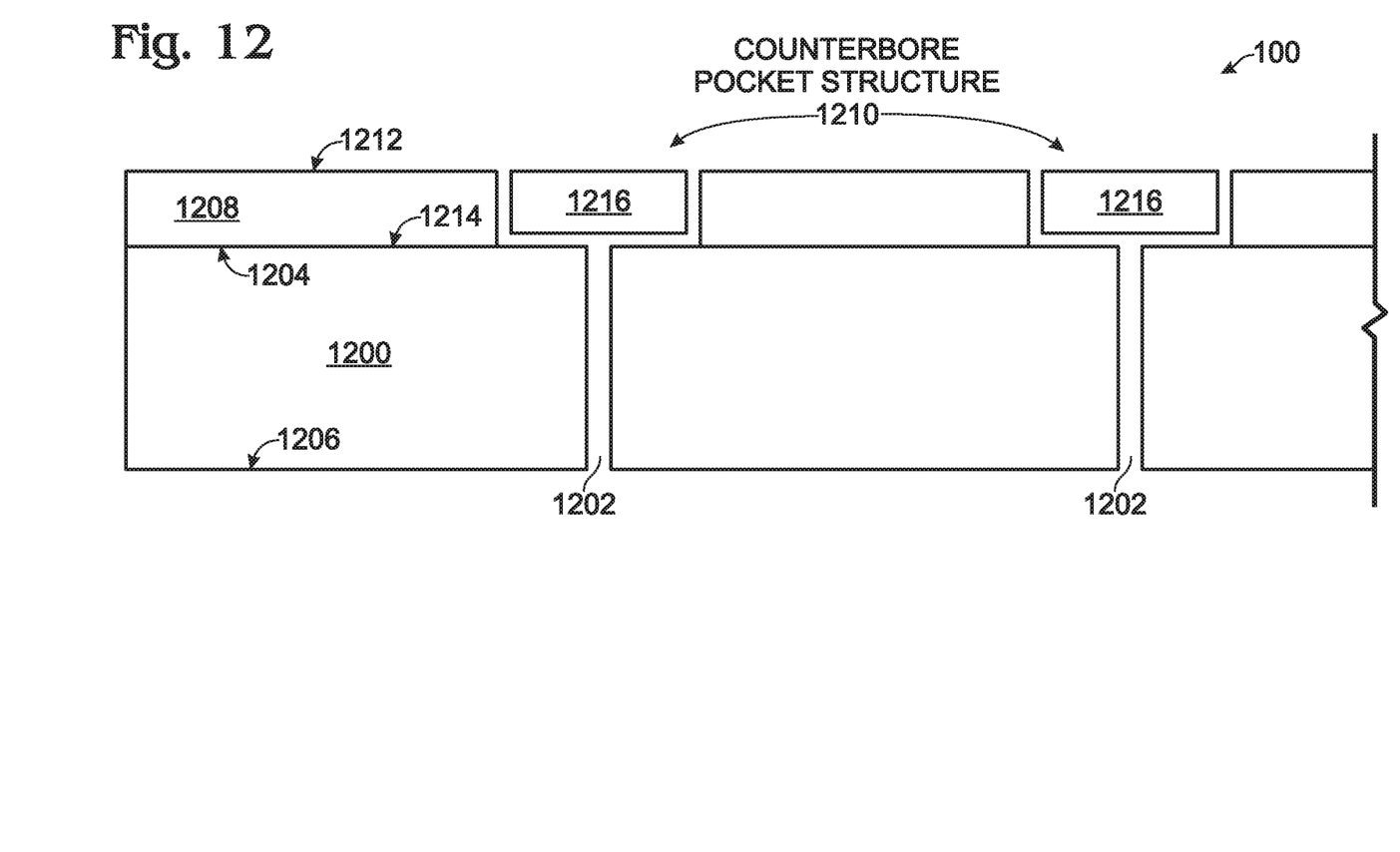
FIG. 12 is a partial cross-sectional view depicting a variation of the fluidic assembly substrate of FIG. 1.

FIG. 12 is a partial cross-sectional view depicting a variation of the fluidic assembly substrate of FIG. 1. In this aspect, the fluidic assembly substrate 100 comprises a first layer 1200, with through-holes 1202 formed between the top surface 1204 and bottom surface 1206. For example, the first layer 1200 may be glass. A thin-film 1208 is formed is formed over the first layer 1200 with counterbore pocket structures 1210 between a top surface 1212 and a bottom surface 1214, over the through-holes 1202. The counterbore pocket structures 1210 may be circular in shape, as shown in FIG. 2, or have the keyhole shapes of FIG. 3 or 4 (not shown in this figure). In one aspect, the thin-film 1208 is transparent. When assembled, the substrate assembly further comprises objects 1216 occupying the counterbore pocket structures 1210.

A substrate assembly and associated fluidic assembly process have been provided. Examples of shapes, materials, and uses have been presented to illustrate the invention. However, the invention is not limited to merely these examples. Other variations and embodiments of the invention will occur to those skilled in the art.

The invention claimed is:

1. A fluidic assembly substrate comprising:
a substrate comprising a top surface and a bottom surface;
a plurality of pocket structures extending from the substrate top surface into the substrate, wherein at least one of the pocket structures has a keyhole shape with a first portion overlying a through-hole and having a first diameter, and a second portion overlapping the first portion, the second portion having a crescent moon-shape with a second diameter, and wherein the second diameter is greater than the first diameter; and,
wherein the through-hole is formed between the at least one pocket structure and the substrate bottom surface.

2. The fluidic assembly substrate of claim 1, wherein the substrate comprises:
a first layer with through-holes formed between a first layer top surface and a first layer bottom surface; and,
a second layer with pocket structure formed between a second layer top surface and a second layer bottom surface.

3. The fluidic assembly substrate of claim 1, wherein the substrate is transparent.

4. A substrate assembly comprising:
a substrate comprising a top surface and a bottom surface;
a plurality of pocket structures formed in the substrate top surface, wherein the pocket structures have a keyhole shape with a first portion overlying the through-hole, with a first diameter transition fit to accommodate an object diameter, and a second portion overlapping the first portion, having a second diameter greater than the first diameter;
a through-hole formed between each pocket structure and the substrate bottom surface; and,
an object at least sliding fit positioned inside each pocket structure, wherein the sliding fit position includes the object being positioned in the pocket structure and outside of the through-hole.

5. The substrate assembly of claim 4, wherein the through-hole is offset from the first diameter center, away from the second portion.

6. The substrate assembly of claim 4, wherein the substrate is transparent.

7. The substrate assembly of claim 4, wherein the objects are disks; and,
wherein the pocket structures have a keyhole shape with a first portion overlying the through-hole, with a first diameter transition fit to accommodate a disk diameter, and a second portion overlapping the first portion, having a crescent moon-shape with a second diameter greater than the first diameter.

8. The substrate assembly of claim 4, wherein the substrate is transparent; and,
wherein the objects are light emitting diodes (LEDs) in the form of disks.

9. A fluidic assembly apparatus, the substrate comprising:
a substrate including a top surface and a bottom surface;
at least one pocket structure extending from the substrate top surface into the substrate, wherein the pocket structure includes a first region having a first diameter and a second region having a second diameter, wherein the first diameter overlaps the second diameter, and wherein a portion of the first region extends beyond the second diameter; and
a through-hole extending from the first region of the pocket structure to the substrate bottom surface.

10. The apparatus of claim 9, wherein the through-hole has a third diameter, wherein the third diameter is less than both the first diameter and the second diameter.

11. The apparatus of claim 9, wherein the though-hole is off-center on the first diameter.

12. The apparatus of claim 9, wherein the through via is entirely beyond the second diameter.

13. The apparatus of claim 9, wherein the second region is larger than the first region.

14. The apparatus of claim 9, wherein the first radius is less than the second radius.

15. The apparatus of claim 9, wherein the through-hole is offset from a center of the first region and away from the second region.

16. The apparatus of claim 9, wherein the substrate is transparent.

17. The apparatus of claim 9, wherein the through-hole is centered on the first diameter.

18. A fluidic assembly method using a pocket structure, the method comprising:
providing a substrate comprising a top surface and a bottom surface, wherein the substrate includes a plurality of pocket structures extending from the substrate top surface into the substrate, wherein at least one of the pocket structures has a keyhole shape with a first portion overlying a through-hole and having a first diameter, and a second portion overlapping the first portion, the second portion having a crescent moon-shape with a second diameter, wherein the second diameter is greater than the first diameter, and wherein the through-hole is formed between the at least one pocket structure and the substrate bottom surface;
flowing a fluid carrying a plurality of objects over the substrate top surface;
creating a suction pressure at the substrate bottom surface; and,
in response to the suction pressure from the through-holes, drawing the objects into the pocket structures.

19. The method of claim 18, wherein the substrate is transparent.

20. The method of claim 18, wherein the objects are light emitting diodes (LEDs) in the form of disks.

21. The method of claim 18, wherein flowing the fluid over the substrate top surface includes:
arranging the substrate top surface with a substrate first side higher than a substrate second side;
introducing the fluid carrying the plurality of objects to the substrate first side; and,
wherein drawing objects into the pocket structures includes drawing the objects in response to gravity as well as suction pressure.

22. The method of claim 18, wherein flowing the fluid carrying the plurality of objects over the substrate top surface includes flowing a plurality of light emitting diodes (LEDs) over the substrate top surface.

23. A fluidic assembly method using a substrate including pocket structures, the method comprising:
providing a substrate comprising a top surface and a bottom surface, with a plurality of pocket structures extending from the substrate top surface into the substrate, with each pocket structure has a through-hole extending from the pocket structure to the substrate bottom surface, and wherein the pocket structures have a first diameter sliding fit to accommodate a disk diameter;
flowing a fluid carrying a plurality of disks over the substrate top surface;
creating a suction pressure at the substrate bottom surface; and,
in response to the suction pressure from the through-holes, drawing the disks into the pocket structures.

24. The method of claim 23, wherein flowing the fluid over the substrate top surface includes:
arranging the substrate top surface with a substrate first side higher than a substrate second side;
introducing the fluid carrying the plurality of disks to the substrate first side; and,
wherein drawing disks into the pocket structures includes drawing the disks in response to gravity as well as suction pressure.

25. The method of claim 23, wherein providing the substrate includes providing a transparent substrate; and,
wherein flowing the fluid carrying the plurality of disks over the substrate top surface includes flowing a plurality of light emitting diodes (LEDs) in the shape of a disk over the substrate top surface.

* * * * *